(12) United States Patent
Hong

(10) Patent No.: US 9,361,983 B2
(45) Date of Patent: Jun. 7, 2016

(54) SEMICONDUCTOR DEVICE AND METHOD OF REFRESH THEREOF

(71) Applicant: SK hynix Inc., Gyeonggi-do (KR)

(72) Inventor: Ji Man Hong, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 20 days.

(21) Appl. No.: 14/284,095

(22) Filed: May 21, 2014

(65) Prior Publication Data

US 2015/0131374 A1  May 14, 2015

(30) Foreign Application Priority Data

Nov. 12, 2013 (KR) .................. 10-2013-0137075

(51) Int. Cl.
| G11C 7/00 | (2006.01) |
|---|---|
| G11C 16/04 | (2006.01) |
| G11C 16/34 | (2006.01) |
| G11C 7/02 | (2006.01) |
| G11C 7/10 | (2006.01) |
| G11C 11/406 | (2006.01) |

(52) U.S. Cl.
CPC .............. *G11C 16/0483* (2013.01); *G11C 7/02* (2013.01); *G11C 7/1006* (2013.01); *G11C 16/3418* (2013.01); *G11C 11/406* (2013.01); *G11C 11/40618* (2013.01)

(58) Field of Classification Search
CPC ........... G11C 16/3418; G11C 16/0483; G11C 11/406; G11C 11/5628; G11C 2211/4062; G11C 29/52; G11C 11/40618
USPC .................. 365/222, 185.03, 185.11, 185.09, 365/185.17; 714/754, 704, 764
See application file for complete search history.

(56) References Cited

U.S. PATENT DOCUMENTS

| 7,697,359 B2 * | 4/2010 | Lee .................... G11C 16/3431 365/222 |
|---|---|---|
| 8,255,762 B2 * | 8/2012 | Nagadomi .......... G06F 11/1068 714/704 |
| 8,503,231 B2 * | 8/2013 | Kim ...................... G11C 16/26 365/185.03 |

FOREIGN PATENT DOCUMENTS

| JP | 2005-108304 | 4/2005 |
|---|---|---|
| JP | 2012-133642 | 7/2012 |
| KR | 1020090075063 | 7/2009 |
| KR | 1020120128014 | 11/2012 |

* cited by examiner

*Primary Examiner* — David Lam
(74) *Attorney, Agent, or Firm* — IP & T Group LLP

(57) ABSTRACT

The present invention relates to a semiconductor device, including memory blocks suitable for storing data, peripheral circuits suitable for refreshing the memory blocks, and a control circuit suitable for controlling the peripheral circuits to change data stored in a first memory block among the memory blocks and refresh the first memory block with changed data, and an operating method thereof.

14 Claims, 8 Drawing Sheets

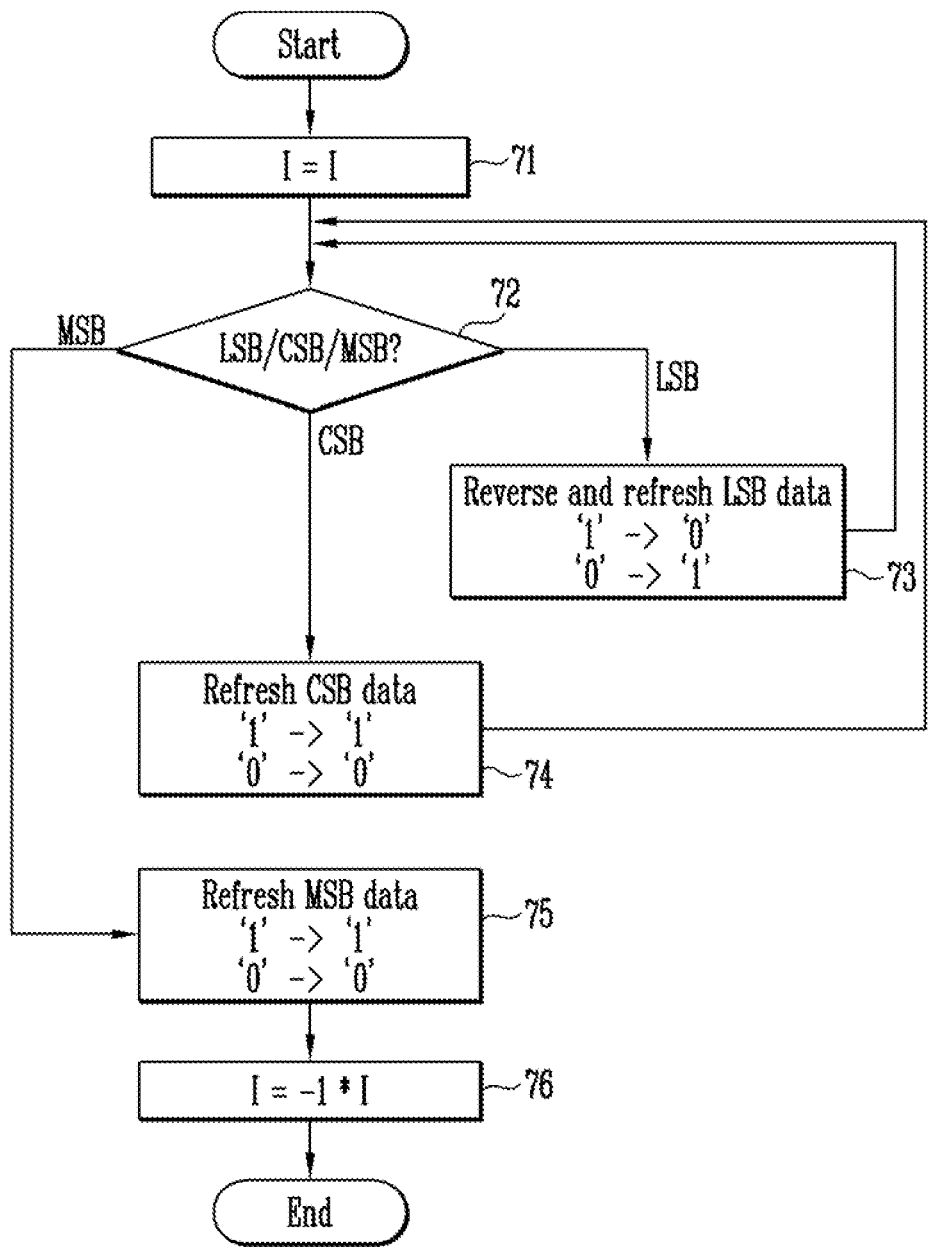

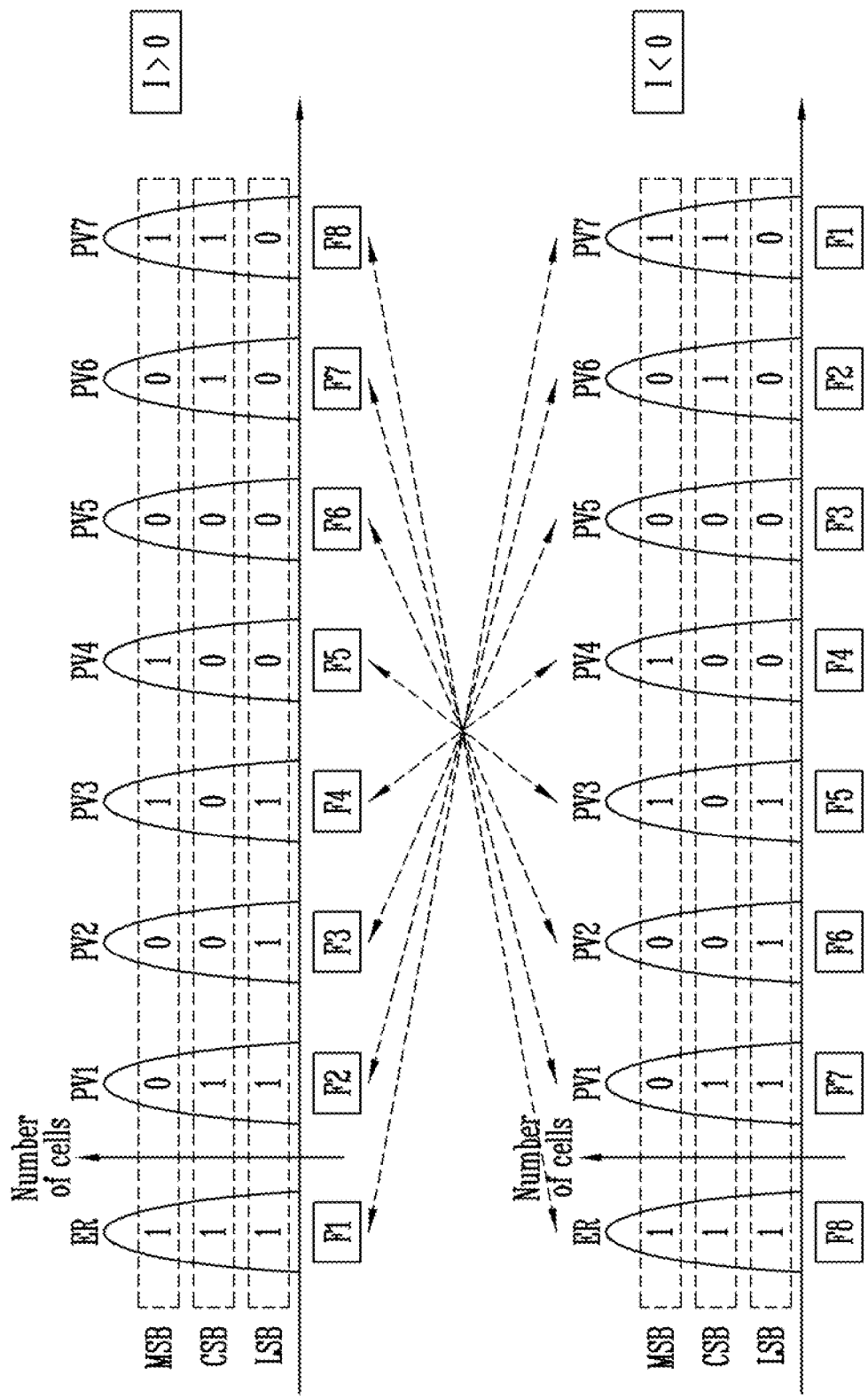

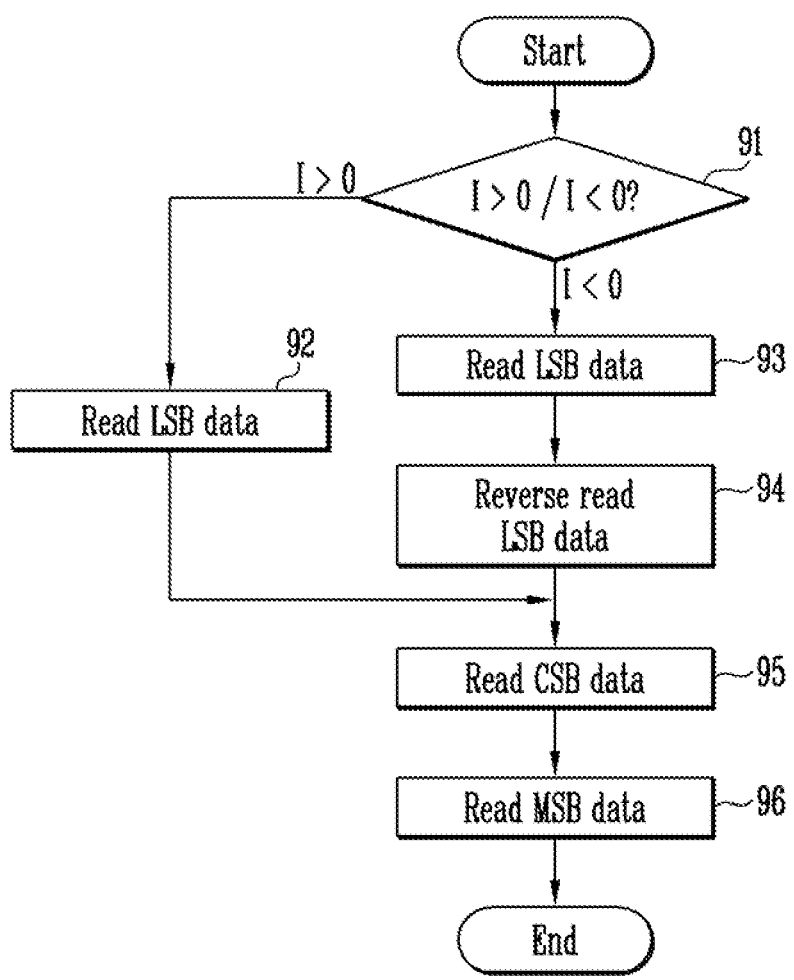

SEMICONDUCTOR DEVICE AND METHOD OF REFRESH THEREOF

CROSS-REFERENCE TO RELATED APPLICATIONS

The present application claims priority of Korean patent application number 10-2013-0137075, filed on Nov. 12, 2013, the entire disclosure of which is incorporated herein by reference in its entirety.

BACKGROUND

1. Field of Invention

Various exemplary embodiments of the present invention relate to a semiconductor device and an operating method thereof, and more particularly, to a refresh operation of a semiconductor device.

2. Description of Related Art

Semiconductor devices often have a plurality of memory cells for storing data. Data retention performance of the memory cells determined by their charge retention characteristic. The reliability of semiconductor device memory cells' is proportional to their characteristics.

Data stored in memory cells substantially deteriorates over time due to leakage and the like.

In order to retain the data stored in memory semiconductor devices perform a refresh operation by reprogramming the same data into memory cells at predetermined periods.

Generally, during a refresh operation a semiconductor device reads data from the memory cells and reprograms the read data back into the memory cells, thereby improving threshold voltage distribution of the memory cells and retaining the data.

However, as the refresh operation is repeated, the memory cells continuously receive the same level of stress, so that electrical characteristics may deteriorate.

SUMMARY

Exemplary embodiments of the present invention are directed at a semiconductor device capable of decreasing memory cell stress by changing data stored in the memory cells during a refresh operation, and an operating method thereof.

An exemplary embodiment of the present invention provides a semiconductor device, which may include memory blocks suitable for storing data, peripheral circuits suitable for refreshing the memory blocks, and a control circuit suitable for controlling the peripheral circuits to change data stored in a first memory block among the memory blocks by refreshing the first memory block with the changed data.

An exemplary embodiment of the present invention provides a method of operating a semiconductor device, which may include the steps of copying data of a first memory block to a second memory block, changing the data copied to the second memory block, and refreshing the first memory block by programming the changed data back into the first memory block.

An exemplary embodiment of the present invention also includes a method of operating a semiconductor device, which may be including refreshing memory cells of an erased state, a first program state higher than the erased state, a second program state higher than the first program state, and a third program state higher than the second program state, wherein the memory cells of the erased state are refreshed to be of the third program state, the memory cells of the first program state are refreshed to be of the second program state, the memory cells of the second program state are refreshed to be of the first program state, and the memory cells of the third program state are refreshed to be of the erased state.

An exemplary embodiment of the present invention may include a semiconductor device including memory blocks suitable for storing data, peripheral circuits suitable for refreshing the memory blocks, and a control circuit suitable for controlling the peripheral circuits to refresh the memory blocks alternatively with first data originally stored in the memory blocks, and second data including one or more bits reversed from the first data.

According to the exemplary embodiments of the present invention, it is possible to decrease stress of the memory cells by changing the data stored during a refresh operation. Accordingly, it is possible to prevent deterioration of electrical characteristics of memory cells and improve reliability of the semiconductor device.

The foregoing summary is illustrative only and is not intended to be limiting in any way. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 7 is a flowchart illustrating a refresh operation of a semiconductor device according to an exemplary embodiment of the present invention;

FIG. 8 is a threshold voltage distribution diagram illustrating data change during a refresh operation according to another exemplary embodiment of the present invention; and FIG. 9 is a flowchart illustrating a read operation of a semiconductor device according to another exemplary embodiment of the present invention.

DETAILED DESCRIPTION

Figure 1:
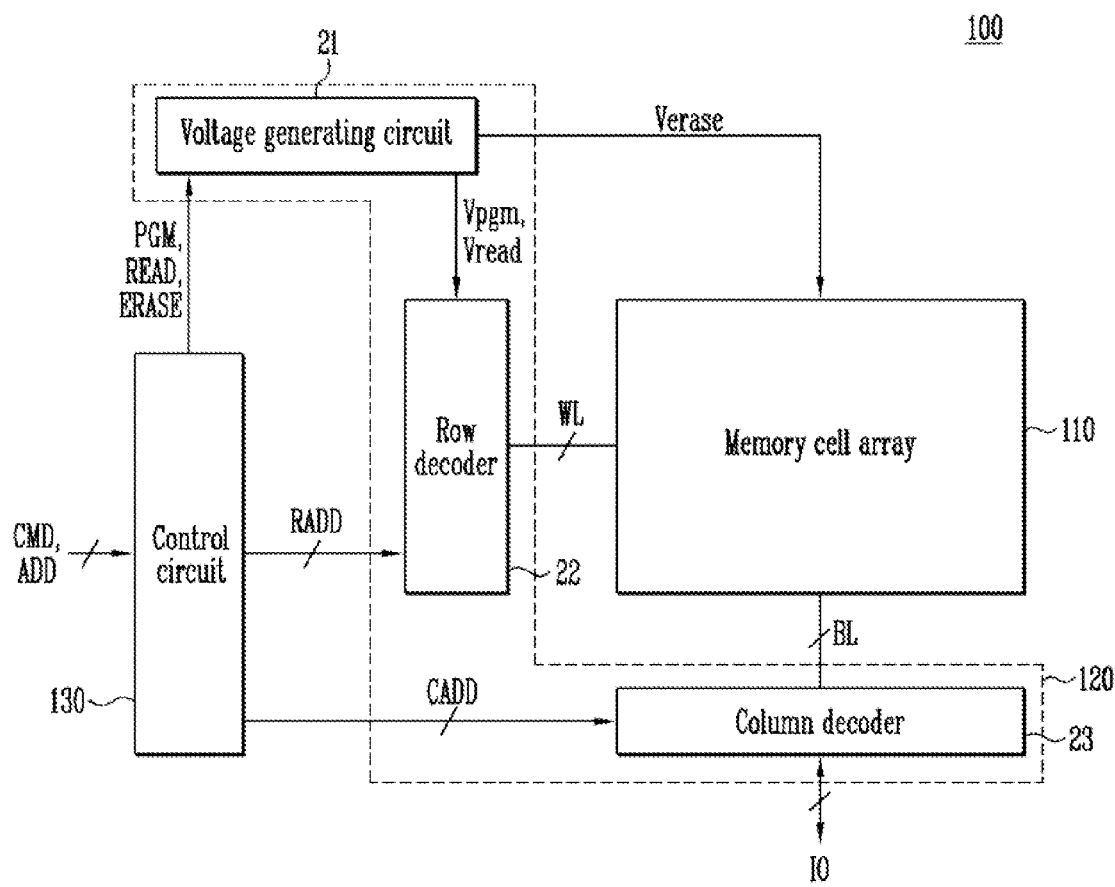
FIG. 1 is a block diagram illustrating a semiconductor device according to the present invention.

Hereinafter, exemplary embodiments of the present invention will be described with reference to the accompanying drawings in detail. However, the scope of the present invention is not limited to the exemplary embodiments disclosed and may be implemented in various forms. Rather, the exemplary embodiments are provided for full disclosure of the present invention and to transfer the spirit of the present invention to those skilled in the art to which it pertains. The scope of the present invention should be understood as defined by the claims. Throughout the disclosure, reference numerals correspond directly to the like numbered parts in the various figures and embodiments. It is also noted that in this specification, "connected/coupled" refers to one component not only directly coupling to another component but also indirectly coupling another component through an intermediate component. In addition, a singular form may include the plural form as long as it is not specifically mentioned.

FIG. 1 is a block diagram illustrating a semiconductor device 100 according to the present invention.

Referring to FIG. 1, the semiconductor device 100 may include a memory cell array 110 configured to store data, peripheral circuits 120 configured to perform program, read, erase, and refresh operations, and a control circuit 130 configured to control the peripheral circuits 120. The refresh operation may be performed by combining the program, read, and erase operations.

The memory cell array 110 may include a plurality of memory blocks (shown in FIG. 2) configured to store data.

The peripheral circuits 120 may include a voltage generating circuit 21, a row decoder 22, and a column decoder 23.

The voltage generating circuit 21 may generate voltages including a program voltage Vpgm, a read voltage Vread, or an erase voltage Verase in response to a program signal PGM, a read signal READ, or an erase signal ERASE. For example, the voltage generating circuit 121 may generate the program voltage Vpgm and the read voltage Vread and supply the generated program voltage Vpgm and read voltage Vread to the row decoder 22, and may generate and supply the erase voltage Verase to the memory cell array 110. Although it is not illustrated in the drawing, the voltage generating circuit 21 may generate voltages with various levels necessary for the program, read, and erase operations, in addition to the program voltage Vpgm, the read voltage Vread, and the erase voltage Verase.

The row decoder 22 may select one of the memory blocks in the memory cell array 110 in response to a row address RADD, and transmit a voltage received from the voltage generating circuit 21 to word lines WL connected to the selected memory block.

The column decoder 23 may transmit/receive data through bit lines BL connected to the memory cell array 110 in response to the column address CADD, and transmit/receive data to/from an external device through input/output lines IO.

The control circuit 130 may be configured to control the peripheral circuits 120 in response to a command signal CMD and an address ADD. Particularly, the control circuit 130 may control the peripheral circuits 120 so as to periodically perform the refresh operation in such a manner that data is changed and re-stored whenever the refresh operation is performed.

Figure 2:
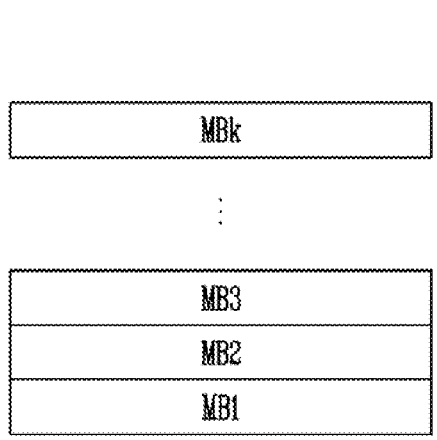
FIG. 2 is a block diagram illustrating a memory cell array shown in FIG. 1.

FIG. 2 is a block diagram illustrating the memory cell array shown in FIG. 1 in detail.

Referring to FIG. 2, the memory cell array 110 may include a plurality of memory blocks MB1 to MBk with each memory block having the same structure. The refresh operation is performed on a memory block selected among the plurality of memory blocks MB1 to MBk.

Figure 3:
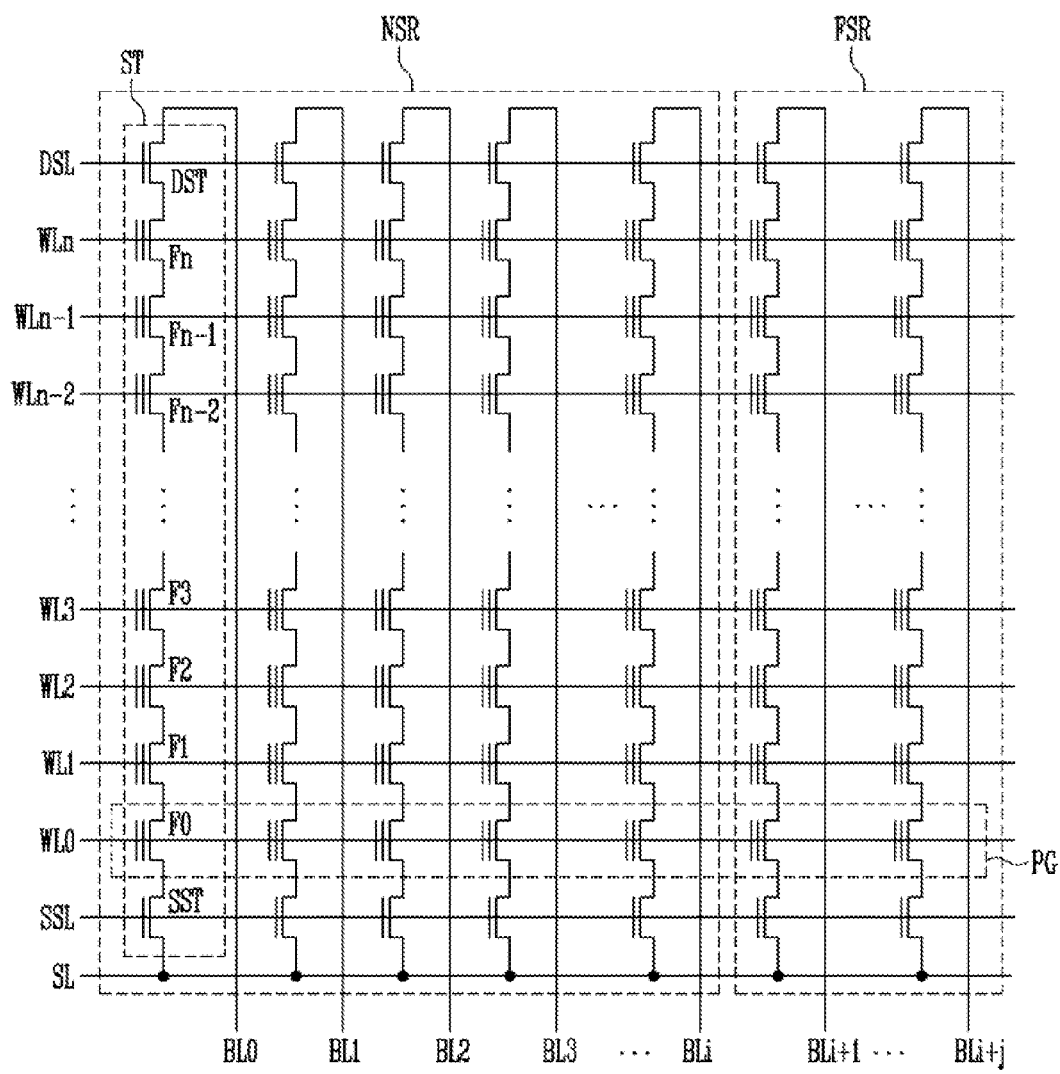
FIG. 3 is a circuit diagram illustrating a memory block shown in FIG. 2.

FIG. 3 is a circuit diagram illustrating the memory block shown in FIG. 2 in detail.

FIG. 3 exemplarily illustrates the first memory block MB1 among the plurality of memory blocks MB1 to MBk. The first memory block MB1 may include a plurality of strings ST having memory cells. Strings ST with memory cells where normal data and copy data are stored may be disposed in a normal string region NSR. Strings ST with memory cells where flag data is stored may be disposed in a flag string region FSR. The copy data refers to normal data duplicated during the refresh operation. The flag data represents a refresh cycle value, which will be described later, during the refresh operation.

The strings ST in the first memory block MB1 are identically configured to each other, so that it is sufficient to describe one string ST as an example.

The string ST may include a drain select transistor DST, a plurality of memory cells F0 to Fn, and a source select transistor SST, which are serially connected to each other. A drain of the drain select transistor DST may be connected to a bit line BL0, and a source of the source select transistor SST may be connected to a source line SL. Gates of the drain select transistors DST included in the other strings ST may be connected to a drain select line DSL, gates of the memory cells F0 to Fn may be connected to word lines WL0 to WLn, and gates of the source select transistors SST may be connected to the source select line SSL. The strings ST may be connected to the bit lines BL0 to BLi+j, respectively. A group of memory cells connected to the same word line may be referred to as a page PG, and the program and read operations may be performed on the page PG unit.

In a multi level cell (hereinafter, referred to as an MLC), each page PG may include a lower bit (least significant bit, hereinafter, referred to as an LSB) page and a higher bit (most significant bit, hereinafter, referred to as an MSB) page. The program operation of the selected page PG may be sequentially performed to the LSB page and the MSB page. Further, the read operation of the selected page PG may also be sequentially performed to the LSB page and the MSB page. The erase operation may be performed on the memory block unit.

In a triple level cell (hereinafter, referred to as a TLC), each page PG may include the LSB page, a center bit (center significant bit, hereinafter referred to as a CSB) page, and the MSB page. The program operation of the selected page PG may be sequentially performed to the LSB page, the CSB page, and the MSB page. Further, the read operation of the selected page PG may also be sequentially performed to the LSB page, the CSB page, and the MSB page. The erase operation may be performed on the memory block unit.

The refresh operation according to exemplary embodiments of the present invention, will be described with reference to the aforementioned semiconductor device.

In the present invention, data of a refresh target memory block may be refreshed within the same memory block. To this end, the refresh operation of the present invention may be performed by temporarily copying the data of the refresh target memory block into the memory cells allocated for copy data, changing the stored copy data, and then returning the changed copy data back into the refresh target memory block.

Before describing the refresh operation in detail, names will be defined below.

A refresh target memory block is defined as a first memory block.

The normal data originally stored in the first memory block is defined as first data.

A memory block, in which the copy data of the first data is stored, is referred to as a second memory block.

The refreshed data of the first memory block, which may or may not be changed from the copy data of the first data, is defined as second data.

The refresh operation will be described in detail below.

When the refresh operation is started, first data stored in the first memory block may be copied to the second memory block. To this end, the second memory block may be selected among the memory blocks in an erased state. When the copy operation is completed, the first memory block may be erased. In accordance with the exemplary embodiments of the present invention, the subsequent refresh operation method may be performed differently according to whether the cell is a MLC or a TLC. The refresh operation method for the MLC is disclosed in FIGS. 4 to 6, and the refresh operation method for the TLC is disclosed in FIGS. 7 to 9. Each exemplary embodiment will be described in detail below.

Figure 4:
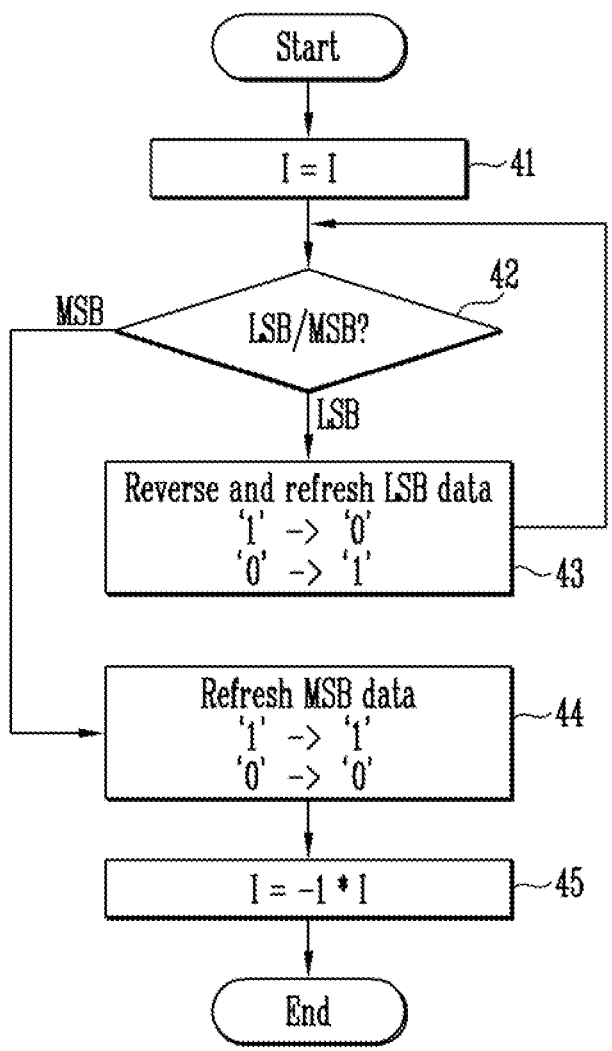
FIG. 4 is a flowchart illustrating a refresh operation of a semiconductor device according to an exemplary embodiment of the present invention.

FIG. 4 is a flowchart illustrating the refresh operation of a semiconductor device 100 according to an exemplary embodiment of the present invention.

Referring to FIG. 4, after the first memory block may be erased, a refresh cycle value I may be read (41). An initial refresh cycling value I may be set to a positive number. Whenever the refresh operation is completed, the refresh cycle value I may toggle between a positive and negative number.

Whether a refresh target page of the first memory block is a LSB page or a MSB page may be determined (42).

When the refresh target page is a LSB page, LSB copy data of the second memory block may be read, the read LSB data may be reversed, and the reversed LSB data may be programmed in the first memory block (43). For example, when the LSB copy data of the second memory block is "1", the LSB data may be reversed to "0", and the reversed LSB data "0" may be programmed in the first memory block. Otherwise, when the LSB copy data of the second memory block is "0", the LSB data may be reversed to "1", and the reversed LSB data "1" may be programmed in the first memory block.

When the refresh operation to the second memory block LSB page copy data is completed, whether the refresh target page is the LSB page or the MSB page may be determined again (42). When the refresh operation to the second memory block LSB page copy data is completed, it may be determined that the refresh operation to the second memory block MSB page copy data may be performed.

In the refresh operation of the second memory block MSB page the MSB copy data, to which the LSB refresh operation may be completed, may be read and the read MSB data may be programmed into the first memory block as is (44). In other words the read MSB copy data may keep its original value of "1" "0" when programmed into the first memory block.

When the refresh operation of the LSB and MSB pages is completed, the refresh cycle value I may toggle from a positive number to a negative number or a negative number to a positive number depending on its original value (45). The purpose of the refresh cycle value I switching from negative to positive and vice versa is for determining whether the second data stored in the first memory block is original data or reversed data during a subsequent read operation. The refresh cycle value I may be stored in the flat string region FSR.

The original data or the first data and the changed data or the second data will be described in detail below.

Figure 5:
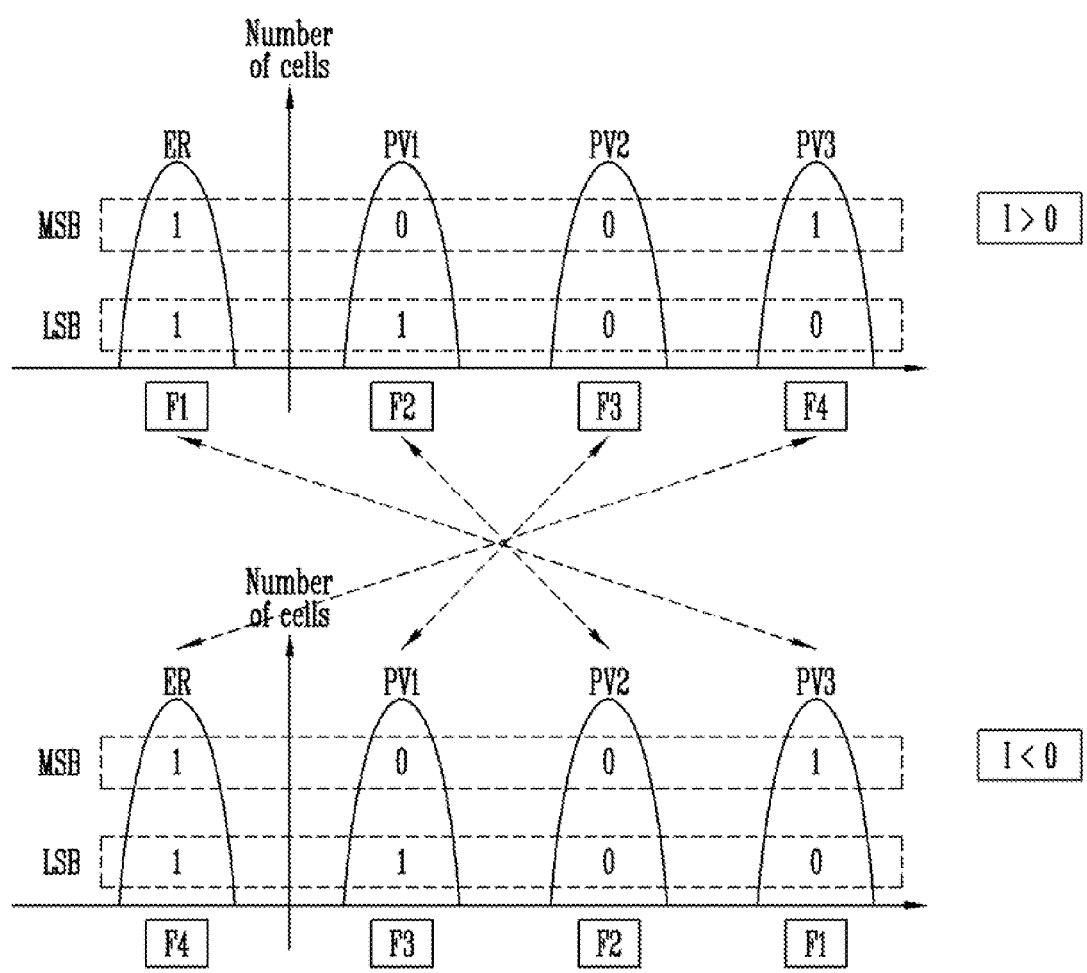
FIG. 5 is a threshold voltage distribution diagram illustrating data change during a refresh operation according to an exemplary embodiment of the present invention.

FIG. 5 is a threshold voltage distribution diagram illustrating data change during the refresh operation according to an exemplary embodiment of the present invention.

Referring to FIG. 5, it is assumed that original data or first data stored in the first to fourth memory cells F1 to F4 are "11", "10", "00", and "01", respectively.

When the refresh cycle value I is a positive number (I>0) and the refresh operation of the first memory block, including the first to fourth memory cells F1 to F4, is performed, the LSB copy data may be reversed and the MSB copy data may keep its original value, so that the second data "01", "00", "10", and "11" may be stored in the refreshed first to fourth memory cells F1 to F4, respectively. That is, memory cells in an erased state ER, a first program state PV1, a second program state PV2, and a third program state PV3 may be programmed to be in the third program state PV3, the second program state PV2, the first program state PV1 and the erased state ER, respectively. The threshold voltage distribution of the memory cell states in descending order is the third program state PV3, the second program state PV2, the first program state PV1, and the erased state ER.

However, when the refresh cycle value I is a negative number (I<0) and the refresh operation of the first memory block, including the first to fourth memory cells F1 to F4, is performed, the LSB copy data may be reversed and the MSB copy data may keep the original value, so that the original first data may be stored in the refreshed first memory block again.

When the refresh operation is performed with reversed LSB data it is possible to decrease the stress that the memory cells receive compared to related art where the same data is repeatedly refreshed. For example, since the memory cells of the third program state PV3, which may be the highest memory cell state among the states ER to PV3 in the threshold voltage distribution, receives high program voltages for maintaining the third program state PV3 whenever a refresh operation is performed, the memory cells may repeatedly receive physical stress. When the same data is stored in the same memory cells of a specific region for an extended amount of time, memory cells in another region may experience interference. However, in accordance with exemplary embodiments of the present invention, the refresh operation may be performed with a data changing step. It is therefore possible to decrease the stress which individual memory cells receive by way of distributing the stress. It is also possible to suppress the generation of interference that memory cells in another region may experience. The result of these changes should result in increased reliability of the semiconductor device.

When the refresh operation is performed, the original data or changed data may be stored as second data in the first memory block and therefore the read operation may be performed as described below.

Figure 6:
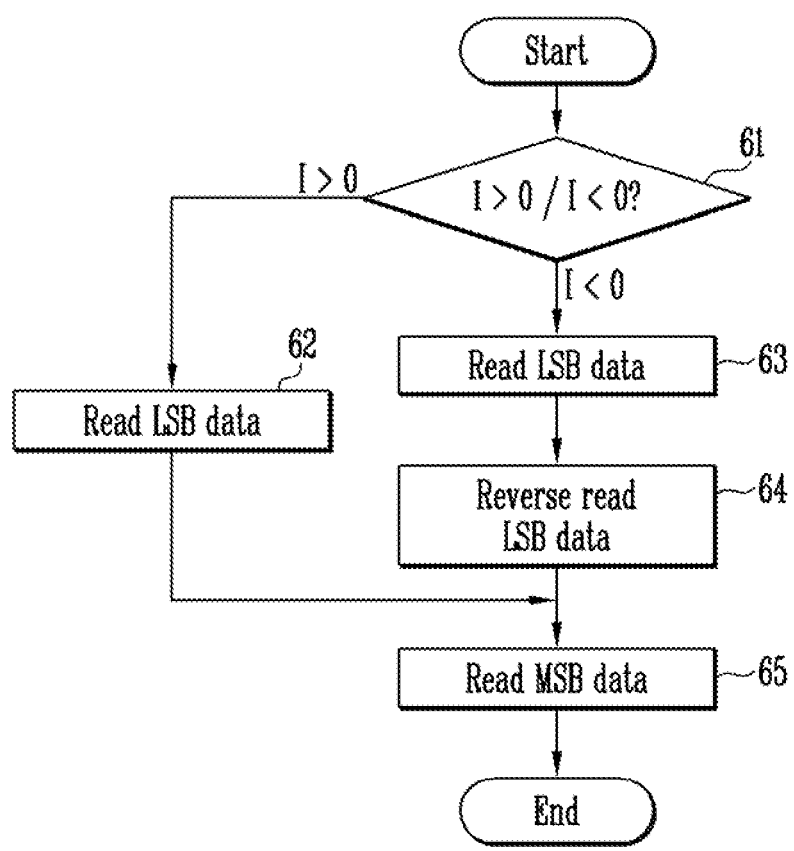
FIG. 6 is a flowchart illustrating a read operation of a semiconductor device according to an exemplary embodiment of the present invention.

FIG. 6 is a flowchart illustrating the read operation of the semiconductor device 100 according to an exemplary embodiment of the present invention.

Referring to FIG. 6, whether the refresh cycle value I of the selected memory block is a positive number (I>0) or a negative number (I<0) may be determined (61). For example, the flag region, where flag data for the refresh cycle value I is stored of the selected memory block may be read, and whether the refresh cycle value I of the selected memory block is a positive number (I>0) or a negative number (I<0) may be determined based on the read flag data.

When the refresh cycle value I of the selected memory block is a positive number (I>0), which may represent that the original data is stored in the corresponding memory block, the LSB data may be read as it is (62), and subsequently, the MSB data may also be read as it is (65). Since all of the LSB data and the MSB data may be read as they are, the original data may be read.

When the selected memory block refresh cycle value I is a negative number (I<0), which may represent that the changed data is stored as the second data in the corresponding memory block, the LSB data of the second data may be read (63), and the read LSB data may be reversed back (64). Next, the MSB data of the second data may be read as it is (65). As described above, even though the reversed LSB data may be stored as the second data in the first memory block, the reversed LSB data may be reversed back and it is possible to read the original data.

FIG. 7 is a flowchart illustrating the refresh operation of a semiconductor device according to an exemplary embodiment of the present invention.

Referring to FIG. 7, after the first memory block is erased, the refresh cycle value I may be read (71). An initial value of the refresh cycling value I may be set to a positive number. Whenever the refresh operation is finished, the refresh cycle value I may toggle between a positive and negative number.

Whether a refresh target page of the first memory block is an LSB page, a CSB page, or an MSB page may be determined (72).

When the refresh target page is a LSB page, second memory block LSB copy data may be read, the read LSB data may be reversed, and the reversed LSB copy data may be programmed in the first memory block (73).

When the refresh operation of the second memory block LSB page copy data is completed, whether the refresh target page may be the LSB page, the CSB page, or the MSB page may be determined again (72). When the refresh operation to the second memory block LSB page copy data is completed, it may be determined that the refresh operation to the second memory block CSB page copy data may be performed.

In the refresh operation of the second memory block CSB page, the CSB copy data, of which the LSB refresh operation may be completed, may be read, and the read CSB data may be programmed in the first memory block as it is (74). That is, the read CSB copy data may remain as it was originally and the CSB copy data may be programmed in the first memory block, which means that the second CSB data remains as it was originally.

When the refresh operation to the second memory block CSB page copy data is completed, whether the refresh target page is a LSB page, a CSB page, or a MSB page may be determined again (72). When the refresh operation to the second memory block CSB page copy data is completed, it may be determined that the refresh operation to the second memory block MSB page copy data may be performed.

In the refresh operation of the second memory block MSB page the MSB copy data, of which the CSB refresh operation may be completed, may be read, and the read MSB data may be programmed in the first memory block as it is (75). That is, the read MSB copy data may remain as it was originally and be programmed in the first memory block.

When the refresh operations of the LSB, CSB, and MSB pages are completed, the refresh cycle value I may toggle to a positive or negative number to store the changed refresh cycle value I (76). For example, when the refresh cycle value I is a positive number, the refresh cycle value I may toggle to a negative number after the refresh operation is completed, and when the refresh cycle value I is the negative number, the refresh cycle value I may toggle to a positive number after the refresh operation is completed. The purpose of the refresh cycle value I switching from negative to positive and vice versa is for determining whether the second data stored in the first memory block is original data or reversed data during a subsequent read operation. The refresh cycle value I may be stored in the flat string region FSR. FIG. 8 is a threshold voltage distribution diagram illustrating data change during the refresh operation according to an exemplary embodiment of the present invention.

Referring to FIG. 8, it is assumed that original data or the first data stored in the first to eighth memory cells F1 to F8 are "111", "110", "100", "101", "001", "000", "010", and "011", respectively.

When the refresh cycle value I is a positive number (I>0) and the refresh operation of the first memory block, including the first to eighth memory cells F1 to F8 is performed, the LSB copy data may be reversed, and the CSB and MSB copy data may keep its original value, so that the second data "011", "010", "000", "001", "101", "100", "110", and "111" may be stored in the refreshed first to eighth memory cells, F1 to F8, respectively. That is, memory cells in an erased state ER and first to seventh program states PV1 to PV7 may be programmed reversely to be in the seventh to first program states PV7 to PV1 and the erased state ER, respectively. The threshold voltage distribution of the memory cell states in descending order is the seventh to first program states PV7 to PV1 and the erased state R.

However, when the refresh cycle value I is a negative number (I<0), and the refresh operation of the first memory block, including the first to eighth memory cells F1 to F8, is performed the LSB data of the copy data may be reversed and the CSB and MSB copy data may keep its original value so that the original first data may be stored in the refreshed first memory block again.

As described above, when the refresh operation is performed with the reversed LSB data, it is possible to decrease the stress that the memory cell receives compared to related art where the same data is repeatedly refreshed. That is, in the related art, when the same data is repeatedly refreshed, corresponding memory cells continuously receive the same stress level. Since memory cells of the seventh program state PV7, which may be the highest memory cell state among the states ER and PV1 to PV7 in the threshold voltage distribution, receive high program voltages for maintaining the seventh program state PV7 whenever the refresh operation is performed, the memory cells may repeatedly receive high physical stress. Further, when the same data is stored in the same memory cells of a specific region for an extended amount of time, memory cells in another region may experience interference. However, in accordance with the exemplary embodiments of the present invention, it is possible to reduce stress and suppress generation of interference by changing data during the refresh operation, thereby improving reliability of the semiconductor device.

When the refresh operation is performed as mentioned in the exemplary embodiments, the original data or the changed data may be stored as the second data in the first memory block and therefore the read operation may be performed as described below.

FIG. 9 is a flowchart illustrating the read operation of a semiconductor device 100 according to another exemplary embodiment of the present invention.

Referring to FIG. 9, whether the refresh cycle value I of the selected memory block is a positive number (I>0) or a negative number (I<0) may be determined (91). For example, the flag region, where flag data for the refresh cycle value I is stored, of the selected memory block may be read, and whether the refresh cycle value I of the selected memory block is a positive number (I>0) or a negative number (I<0) may be determined based on the read flag data.

When the refresh cycle value I of the selected memory block is a positive number (I>0) which may represent that original data is stored in the corresponding memory block, the LSB data may be read as it is (92), and subsequently, the CSB data may be read as it is (95), and the MSB data may be also read as it is (96). As described above, all original data may be read because the LSB data, CSB data, and the MSB data may be read as they are.

When the refresh cycle value I of the selected memory block is a negative number (I<0), which may represent that the changed data is stored as the second data in the corresponding memory block, the second LSB may be read (93), and the read LSB data may be reversed (94). Next, the CSB data may be read as it is (95) and the MSB data may be read as it is (96). As described above, even though the reversed LSB data may be stored as second data in the first memory block, the reversed LSB data may be reversed again making it possible to read the data as it was originally.

As described above, exemplary embodiments have been disclosed in the drawings and the specification. The specific terms used herein are for purposes of illustration, and do not limit the scope of the present invention defined in the claims. Accordingly, those skilled in the art will appreciate that various modifications and other equivalent examples may be made without departing from the scope and spirit of the present disclosure. Therefore, the scope of the present invention will be defined by the accompanying claims.

What is claimed is:

1. A semiconductor device, comprising:
   memory blocks suitable for storing data, wherein each of the memory blocks includes a normal string region in which normal data and copy data are stored and a flag string region in which flag data is stored;
   peripheral circuits suitable for refreshing the memory blocks; and
   a control circuit suitable for controlling the peripheral circuits to change data stored in a first memory block among the memory blocks and refresh the first memory block with the changed data,
   wherein the copy data is a duplicate of the normal data, which is stored in the first memory block, stored in a second memory block in order to refresh the first memory block, and the flag data corresponds to a refresh cycle value.

2. The semiconductor device of claim 1, wherein the control circuit controls the peripheral circuits to set a refresh cycle value, copy data of the first memory block to a second memory block, erase the first memory block, change the copied data of the second memory block, program the changed data in the first memory block, and reset the refresh cycle value.

3. The semiconductor device of claim 2, wherein the semiconductor device includes a multi-level cell (MLC), and the control circuit controls the peripheral circuits to reverse LSB data and program the reversed LSB data in the first memory block and program MSB data in the first memory block as it is.

4. The semiconductor device of claim 1, wherein the control circuit controls the peripheral circuits to further store a flag data identifying the data or the changed data stored in the memory blocks.

5. The semiconductor device of claim 4, wherein the control circuit controls the peripheral circuits further to reverse back the changed data to the data based on the flag data during a read operation of the memory blocks.

6. A method of operating a semiconductor device, comprising:
   setting a refresh cycle value;
   copying data of a first memory block to a second memory block;
   erasing the first memory block;
   changing the data copied to the second memory block and refreshing the first memory block by programming the changed data in the first memory block; and
   resetting the refresh cycle value.

7. The method of claim 6, wherein the semiconductor device includes an MLC, and
   wherein the changing of the data and the refreshing of the first memory block includes:
   reading an LSB page of the second memory block;
   reversing LSB data of the read LSB page;
   programming the reversed LSB data in the first memory block;
   reading an MSB page of the second memory block; and
   programming MSB data of the read MSB page in the first memory block.

8. The method of claim 6, wherein the semiconductor device includes a triple level cell (TLC), and
   wherein the changing of the data and the refreshing of the first memory block includes:
   reading an LSB page of the second memory block;
   reversing LSB data of the read LSB page;
   programming the reversed LSB data in the first memory block;
   reading a CSB page of the second memory block;
   programming CSB data of the read CSB page in the first memory block;
   reading an MSB page of the second memory block; and
   programming MSB data of the read MSB page in the first memory block.

9. The method of claim 6, further comprising:
   reading the refresh cycle value;
   reading the data stored in the first memory block as it is when the read refresh cycle value is a positive value; and
   reading the data stored in the first memory block and then changing the read data when the read refresh cycle value is a negative value.

10. The method of claim 9, wherein the changing of the read data includes reversing the read LSB data of the first memory block.

11. A method of operating a semiconductor device, comprising:
    refreshing memory cells of an erased state, a first program state higher than the erased state, a second program state higher than the first program state, and a third program state higher than the second program state,
    wherein the memory cells of the erased state are refreshed to be of the third program state,
    the memory cells of the first program state are refreshed to be of the second program state,
    the memory cells of the second program state are refreshed to be of the first program state, and
    the memory cells of the third program state are refreshed to be of the erased state.

12. The method of claim 11, wherein the refreshing of the memory cells reverses and programs LSB data among original data stored in the memory cells, and programs MSB data among the original data as it is.

13. The method of claim 11, further comprising:
    alternating a refresh cycle value between first and second values whenever the refreshing of the memory cells is completed.

14. The method of claim 13, wherein the first and second values are different to each other.

* * * * *